(12) United States Patent
Woro (10) Patent No.: US 7,500,391 B2
(45) Date of Patent: Mar. 10, 2009

(54) SYSTEM AND METHOD FOR IDENTIFYING THE SOLAR POTENTIAL OF ROOFTOPS

(75) Inventor: Aaron William Woro, Boulder, CO (US)

(73) Assignee: Ecometriks, LLC, Boulder, CO (US)

( * ) Notice: Subject to any disclaimer, the term of this patent is extended or adjusted under 35 U.S.C. 154(b) by 119 days.

(21) Appl. No.: 11/740,087

(22) Filed: Apr. 25, 2007

(65) Prior Publication Data

US 2008/0105045 A1    May 8, 2008

Related U.S. Application Data

(60) Provisional application No. 60/796,033, filed on Apr. 27, 2006.

(51) Int. Cl.
*G01W 1/00* (2006.01)
(52) U.S. Cl. .............. 73/170.27; 126/621; 126/623
(58) Field of Classification Search ............ 73/170.27; 126/621, 623
See application file for complete search history.

(56) References Cited

U.S. PATENT DOCUMENTS

| | | | |
|---|---|---|---|
| 4,380,996 A * | 4/1983 | Mengeringhausen | 126/621 |
| 4,418,684 A * | 12/1983 | Sanders et al. | 126/621 |
| 5,943,164 A | 8/1999 | Rao | |
| 6,338,027 B1 | 1/2002 | Fulton | |
| 6,748,327 B1 | 6/2004 | Watson | |

(Continued)

OTHER PUBLICATIONS

Broesamle, H., Mannstein, H.; Schillings, C.; Trieb, F.; Assessment of Solar Electricity Potentials In North Africa Based On Satellite Data And A Geographic Information System; Solar Energy vol. 70, No. 1, pp. 1-12, Feb. 10, 2000, published 2001.

(Continued)

*Primary Examiner*—Andre J Allen
*Assistant Examiner*—Jermaine Jenkins
(74) *Attorney, Agent, or Firm*—Lathrop & Gage LLP (57) ABSTRACT

A system and method for identifying the solar potential of rooftops. In one embodiment, solar-potential criteria and three-dimensional spatial data and tabular data, for a selected area including parcels on which the rooftops are located, are entered into a geographic information system. Three-dimensional aerial data of the selected area, including the rooftops in the selected area, is collected. Solar azimuth and altitude angles are calculated for regular intervals to generate shadow simulation data representing shadows cast onto the rooftops by obstructions. The shadow simulation data is intersected with the XYZ coordinates of the rooftop shapes, as determined from the aerial data, to generate rooftop shade patterns for specific intervals over a specific period of time. The tabular data and the rooftop shade patterns are then used to determine addresses and per-parcel specifications of buildings having said rooftops meeting the solar-potential criteria.

24 Claims, 11 Drawing Sheets

U.S. PATENT DOCUMENTS

| | | |
|---|---|---|
| 6,968,295 B1 | 11/2005 | Carr |
| 7,305,983 B1 | 12/2007 | Meder et al. |
| 2003/0074244 A1 | 4/2003 | Braxton |
| 2004/0059691 A1 | 3/2004 | Higgins |
| 2005/0013477 A1 | 1/2005 | Ratti et al. |
| 2005/0017967 A1 | 1/2005 | Ratti et al. |
| 2005/0039787 A1 | 2/2005 | Bing |

OTHER PUBLICATIONS

Rylatt, M.; Gadsden, S.; Lomas, K.; GIS-Based Decision Support For Solar Energy Planning In Urban Environments; Computers, Environment, and Urban System; pp. 579-603; 2001.

Gadsden, Stuart; Rylatt, Mark; Lomas, Kevin; and Robinson, Darren; Predicting The Urban Solar Fraction: a methodology For Energy Advisers and Planners Based On GIS; Energy and Buildings, 37-48; 2003.

* cited by examiner

SYSTEM AND METHOD FOR IDENTIFYING THE SOLAR POTENTIAL OF ROOFTOPS

RELATED APPLICATIONS

The present application claims benefit of U.S. Provisional Patent Application Ser. No. 60/796,033, filed Apr. 27, 2006 the disclosure of which is incorporated herein by reference.

BACKGROUND AND STATEMENT OF THE PROBLEM

The evaluation method for profiling a house's potential for solar power is presently manual labor-intensive. A typical house evaluation includes the required instruments and a climb atop the roof to profile the solar power potential by estimated k/W hours and expected return on investment following the assessment of roof geometry and the effect on shading from obstructions. If the house has the necessary geometric specifications and reasonable annual solar exposure, then a certain solar power system size is recommended. However, the process is time-consuming and relatively expensive.

A typical homeowner who is considering solar power must first find a listing of solar providers, and then arrange a time and date for each one of them to evaluate the house for potential. This often occurs as many as five separate times, as opinions and measurements differ between evaluations. The aggregate effect on the solar industry is considerable. From the initial inquiry through to installation, the resources spent on evaluations can run into the hundreds of dollars. This cost is ultimately passed on to consumers, for whom this is often the chief obstacle when considering solar power. In other cases, those who own houses that are perfectly situated to exploit the benefits of distributed solar power are often unaware of the investment potential. Currently, targeted demographic marketing is the primary tool used in the expansion of solar power.

SOLUTION TO THE PROBLEM

The present system and method solves a key problem in residential solar power distribution by removing the need for physical site visits to survey and qualify houses for potential solar power utilization. Using various types of satellite and remote-sensing technology in addition to datasets already made available by the United States Census Bureau, commercial demographic services, and municipal parcel databases the present system employs GIS, IGS (Interactive Geometric Software), or computer-aided design (CAD) software to analyze numerous variables, in three dimensions, related to a given dwelling, including the surface area of its roof; the slope and direction of the roof's various portions; related address and owner information for each dwelling; also, items specific to the microclimate and precise geographic location of the structure are taken into account by the process including potential shading from trees and other local structures and obstructions. The information required as input data for the GIS system is obtained using aerial remote sensing technology.

By synthesizing currently available software with public and private datasets and the unique processes described herein, a new service becomes available to the solar power industry.

SUMMARY

A system and method are disclosed for identifying the solar potential of rooftops. In one embodiment, solar-potential criteria and three-dimensional spatial data and tabular data, for a selected area including land parcels on which the rooftops are located, are entered into a geographic information system. Three-dimensional aerial data of the selected area, including the rooftops in the selected area, is collected. Solar azimuth and altitude angles are calculated for regular intervals to generate shadow simulation data representing shadows cast onto the rooftops by obstructions. The shadow simulation data is intersected with the XYZ coordinates of the rooftop shapes, as determined from the aerial data, to generate rooftop shade patterns for specific intervals over a specific period of time. The tabular data and the rooftop shade patterns are then used to determine addresses and per-parcel specifications of buildings having said rooftops meeting the solar-potential criteria. This data can then be queried by a system user to generate specific data, for the selected area, matching the user's data preferences.

DETAILED DESCRIPTION

Figure 1:
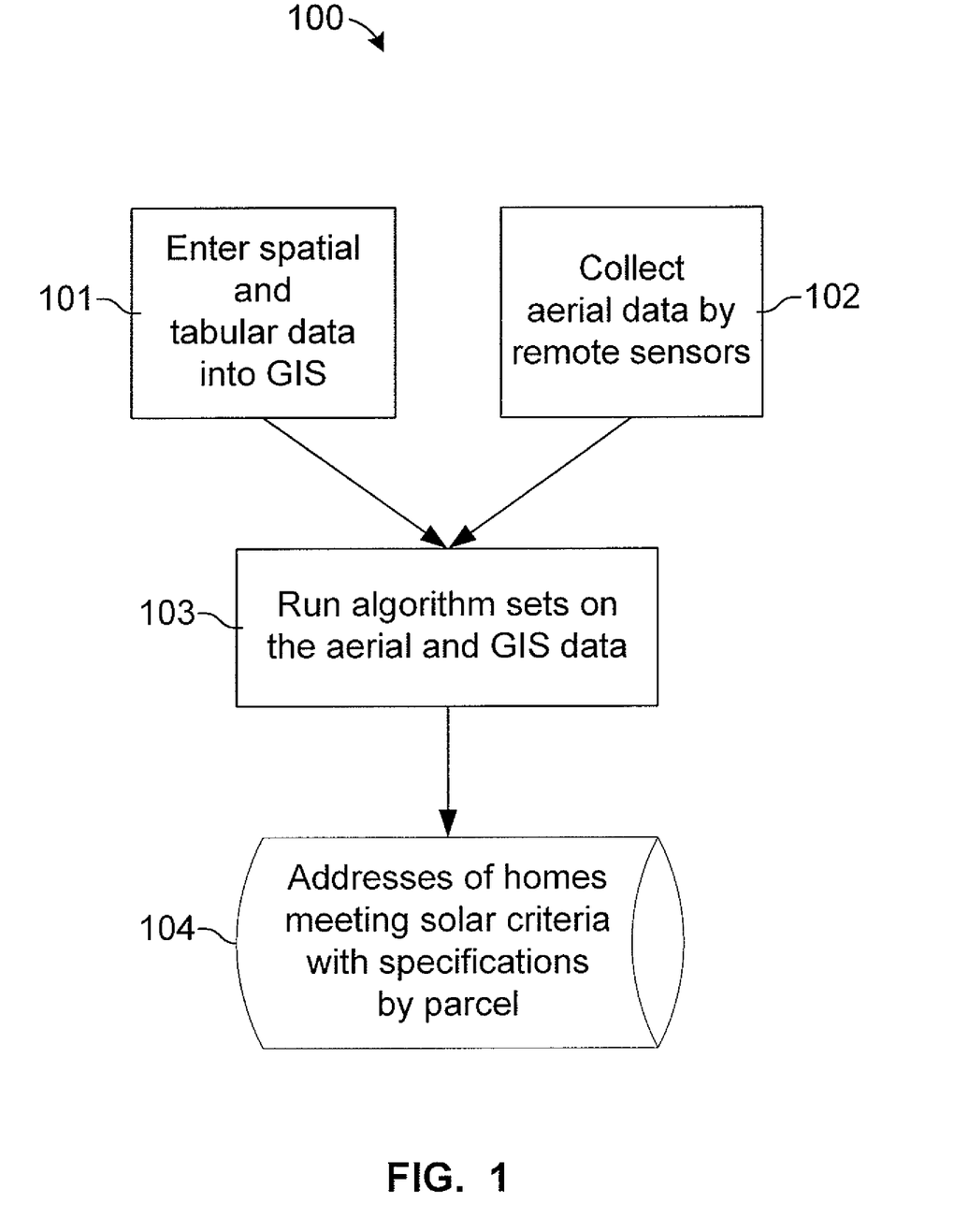
FIG. 1 is a flowchart showing a high-level exemplary embodiment of the present system.

FIG. 1 is a flowchart showing a high-level exemplary embodiment of the present system and method. The present GIS-based technology and associated algorithms deliver an output (a 'solar census') of specific addresses in both cartographic and tabular form that reveal the houses (or other buildings) found to match the defined parameters set by the user. The information delivered also contains the specific data for solar potential for every dwelling within the coverage.

As shown in FIG. 1, at step 101, public and commercial spatial and tabular data are entered into a geographic information system ('GIS'). The present system analyzes the solar potential of houses and other buildings based on variable parameters including some or all of the following specifications and other data:

Roof space
Roof direction
Roof slope
Address and demographic profiles
Lack of tree cover (annual shadow patterns over rooftops)

Listed below are examples of public/commercial datasets that may be used as system inputs in the solar potential evaluation process:

- Parcel frameworks (i.e., property boundaries)
- Digital Elevation Models (used for forestry, flood plain mapping, etc.)
- High-resolution (<30 cm) aerial photography
- Climate inclusive solar irradiance levels At step 102, aerial data is collected. This data may be efficiently collected by an airplane, but may, alternatively, be collected by other types of aircraft (e.g., balloons) or Earth-orbiting vehicles (spacecraft). In an exemplary embodiment, aerial data includes LiDar (Laser Detection and Ranging), LiDar infrared imaging, and aerial photography of parcels of land on which houses and other buildings are located. A digital elevation model (DEM) and/or a digital terrain model (DTM) are extracted from the LiDar and aerial photographs, which are often acquired concurrently during the same flight missions.

An established/standardized GIS-based algorithm set is run to receive data and to allow for geoprocessing, and delivers addresses and precise profiles of houses in a given county (or other areas) that demonstrate various levels of potential for distributed solar power in their entirety, or as specified by the user and/or commercial/government entity making the inquiry. At step 103, algorithm sets (described in detail below) are then run on the aerial and GIS data to generate data 135 in cartographic and tabular form of the solar potential of houses, with solar potential specifications by 'parcel' address, i.e., specifications for a particular plot of land on which a dwelling is located.

The GIS algorithms receive and process the necessary data, which is consistently similar in data requirements that are entered into a geodatabase. The data is then processed (geo-referenced, georectified, tables constructed, layering performed, etc.) and processed by the present system.

Figure 2A:
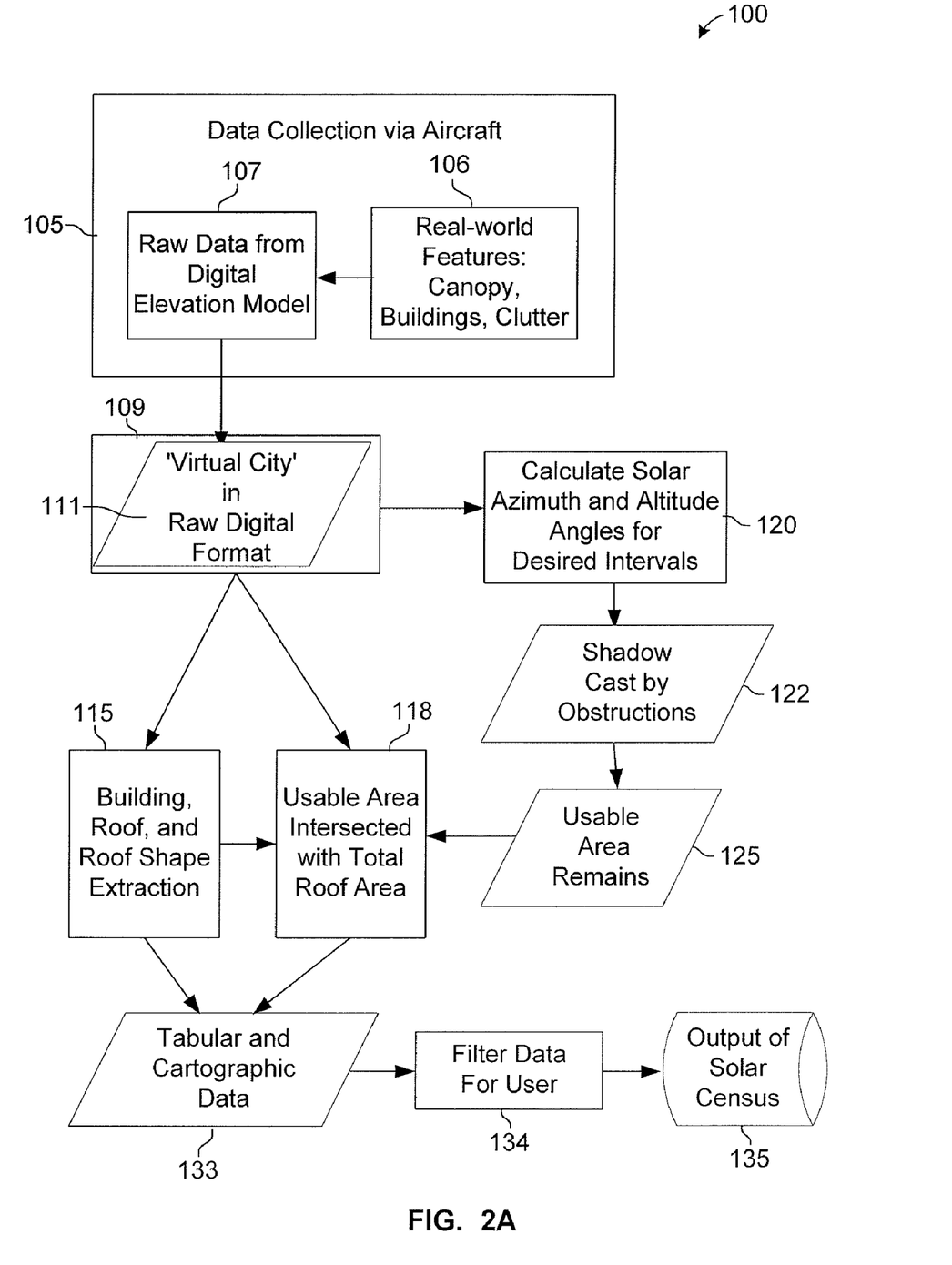
FIG. 2A is a flowchart showing a mid-level exemplary embodiment of the present system.

FIG. 2A is a flowchart showing a mid-level exemplary embodiment of the present system. The data collection method for the present geospatial analysis employs remote sensing technology to extract real-world features in three dimensions, which are stored as X, Y, and Z positions of a spatial coverage (or using an equivalent spatial storage method). As shown in FIG. 2, in block 105, aerial data is collected via aircraft (and/or spacecraft). More specifically, in an exemplary embodiment, the information required as input data for the present GIS system is obtained using airborne remote sensing technology, such as LiDar (Light Detection and Ranging), IFSAR/INSAR (Interferometric Synthetic Aperture Radar), infrared spectrometry, aerial photogrammetry, etc. This input data includes real-world features 106 such as vegetation canopy, buildings, and clutter.

Raw data 107 from one or more digital elevation/terrain models (DEM/DTM) 142, in conjunction with data from real-world features 106, is then used to generate a 'virtual city' 111, at step 109. A virtual city is a digital depiction of real world geography and features, comprising a three-dimensional dataset extracted from one or more digital elevation models via photogrammetry. The digital elevation/terrain models are extracted using LiDar/IFSAR, and may also be generated from other passive/active forms of high resolution remote sensing. Aerial/photogrammetric DEM extraction may be used to generate the digital elevation/terrain models if the technology employed is sufficiently accurate.

Figure 2B:
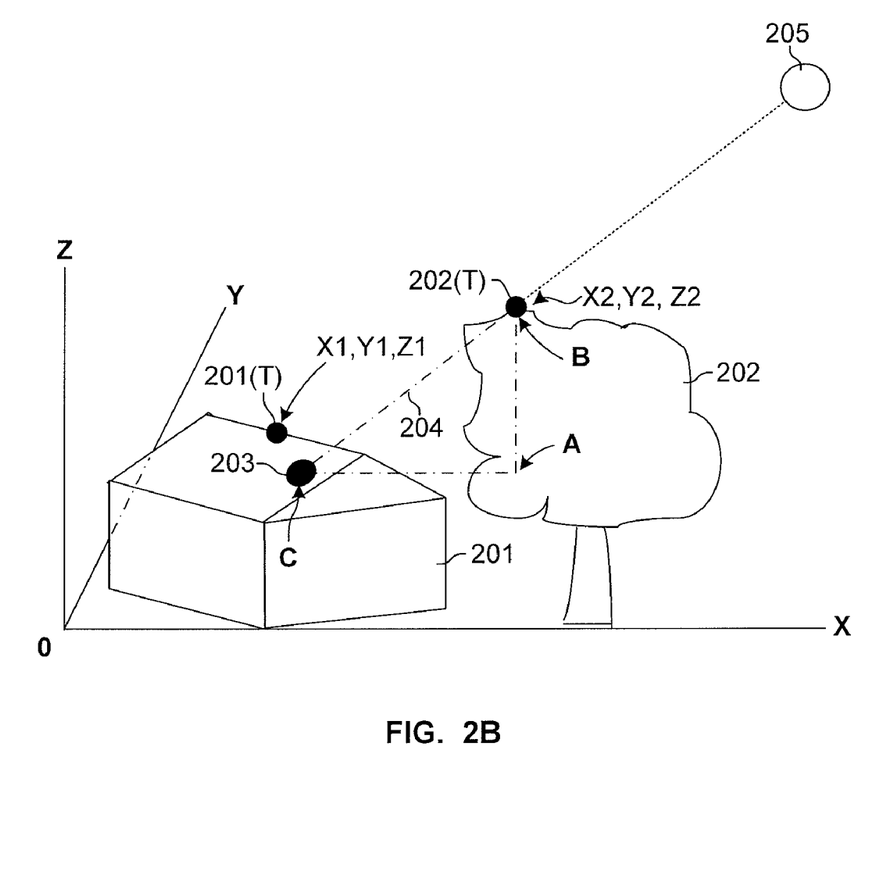
FIG. 2B is a diagram showing a digital elevation/terrain model in terms of XYZ coordinates.

FIG. 2B is a diagram of two elements of virtual city 111 showing example XYZ coordinates (which are employed in all digital elevation/terrain models), using a single building 201 and tree 202 as an example of data included in virtual city 111, comprising DEM/DTM data 142 that has been integrated with data from real-world features 106. As shown in FIG. 2B, the top center 201(T) of building 201 is represented by coordinates X1, Y1, Z1, and the highest point 202(T) of tree 202 is represented by coordinates X2, Y2, Z2.

The furthest point C of shadow 203 from high point 202(T) of tree 202 is used in determining annual shading effects. For any given date/time, point C can be determined with reference to the triangle ABC, where the angle ACB of the triangle (relative to the horizontal) is determined by the line passing between the sun 205, point 202(T), and the rooftop of building 201. In the example of FIG. 2B, given angle ACB, the length 204 of hypotenuse BC of triangle ABC can readily be determined from the height of the roof, the height of point 202(T), and the horizontal distance AC between point 202(T) and point C. The potential tree shadow arc with respect to the rooftop of building 201 can be built on multiple separate calculations (one for each desired interval), as described below in detail with respect to FIGS. 8 and 9.

As shown in FIG. 2A, virtual city DEM/DTM data 111 is processed by GIS system 110 (shown in FIG. 3, described below) to generate tabular and cartographic data 133. More specifically, in step 115, building, roof, and rooftop shape extraction is performed. This process is described in detail below with respect to FIGS. 6, 7, and 8.

In step 120, solar azimuth and altitude angles are calculated for desired intervals (e.g., every 6 minutes over an annual/monthly/weekly time period) to determine the shadow 122 cast by obstructions including vegetation, buildings and other structures. The usable remains 125 of the rooftop sections are then generated, and then the XY shadow simulation data is intersected with the XY coordinates of the rooftop areas, in step 118, to yield overlaid files, having spatial attributes, showing rooftop areas that are shade-free (or which have shadow cover less than a pre-specified percentage of time) over the course of a year or other specific period of time. All points/pixels that exist outside these coordinate boundaries are deleted. This process is described in detail below with respect to FIG. 9.

Next, the outputs of process steps 115 and 118 are formatted in both tabular and cartographic form, at step 133. The tabular and cartographic data is then filtered as requested by a system user in step 134 to provide solar census output 135.

Figure 3:
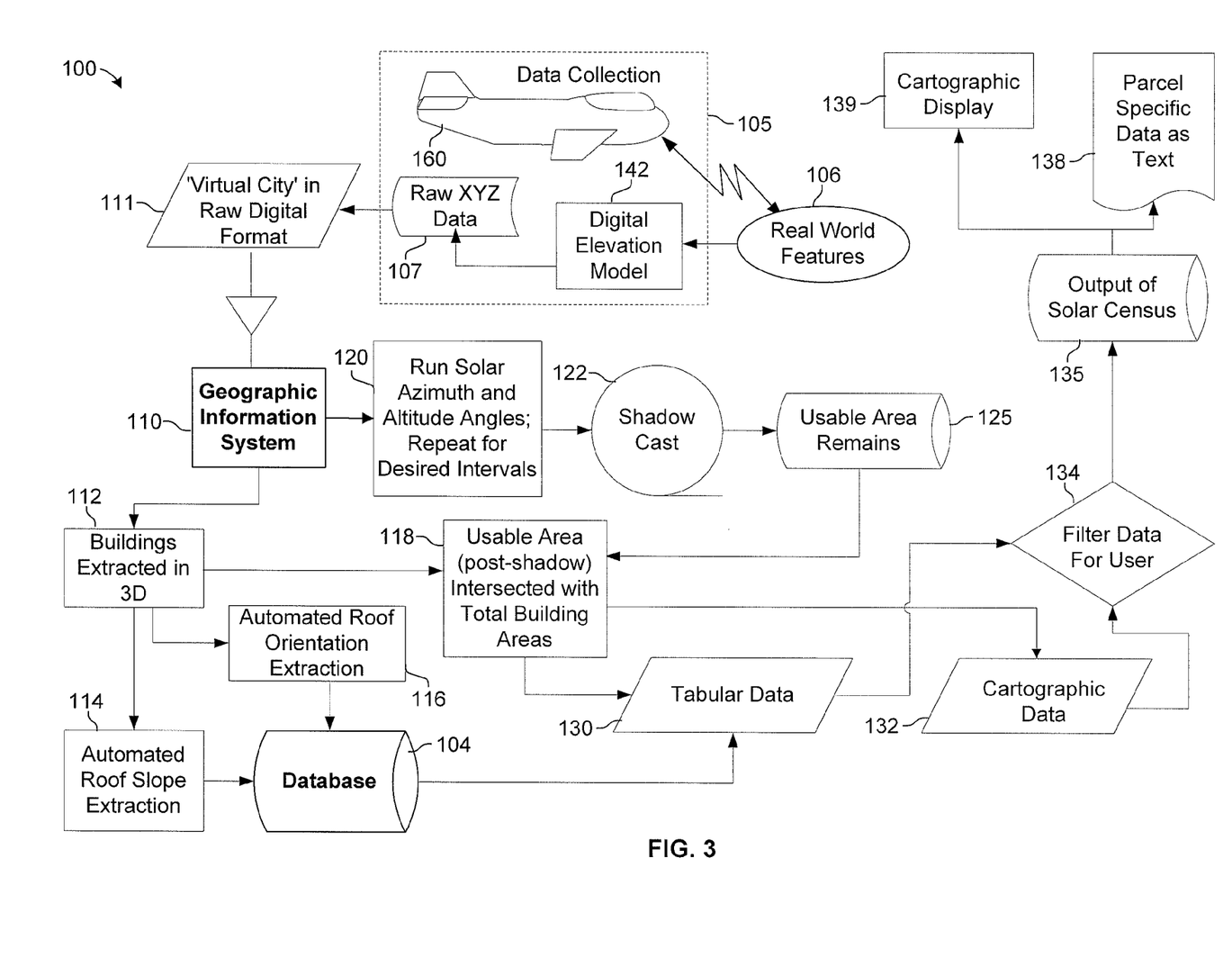
FIG. 3 is a flowchart showing an exemplary embodiment of the present system in greater detail.

FIG. 3 is a flowchart showing an exemplary embodiment of the present system in greater detail. As shown in FIG. 3, data collection is performed by aircraft 160 (and/or spacecraft) at step 105, as described above with respect to FIG. 2A. Raw data 107 from digital elevation/terrain models (DEM/DTM) 142, in conjunction with real-world features 106, is then used to generate 'virtual city' 111, the DEM/DTM data for which is transmitted from the aircraft 160 to GIS 110.

Figure 4:
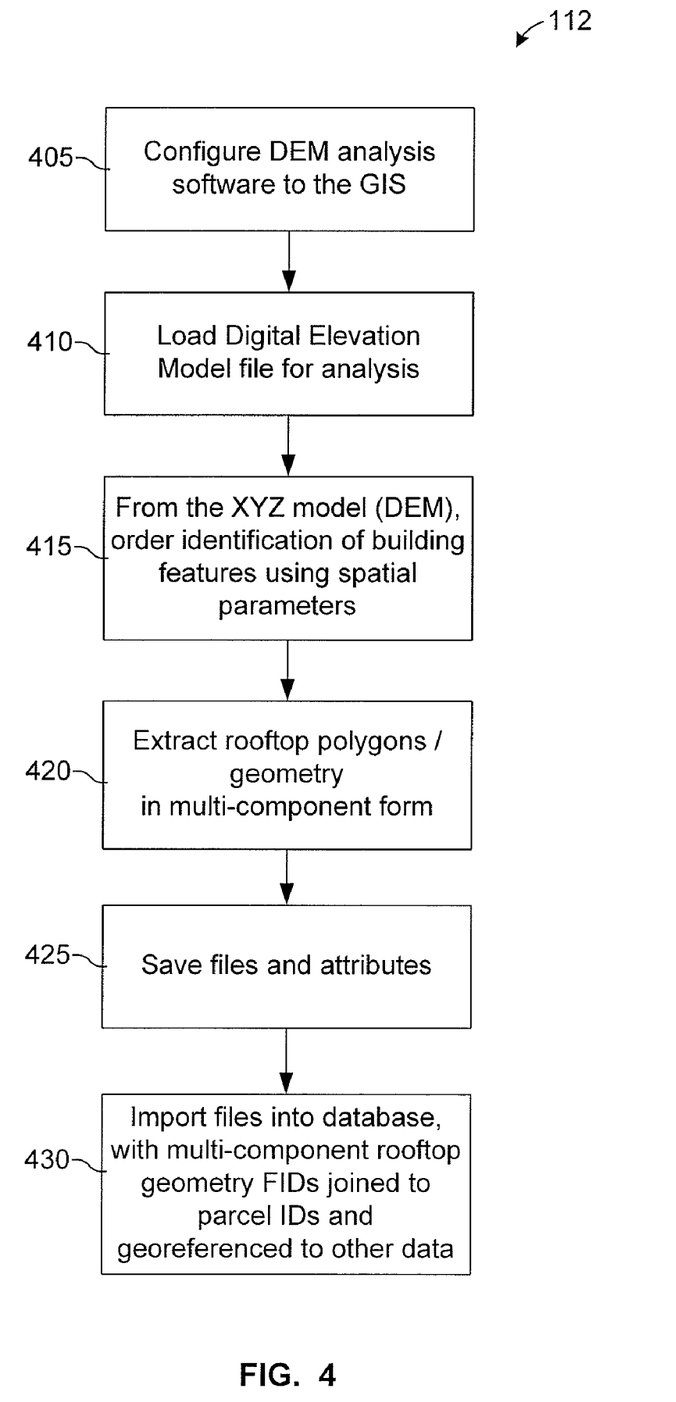
FIG. 4 is a flowchart showing exemplary details of process 112 for extracting buildings and rooftops as three-dimensional vector or raster files.

Extracting buildings/rooftops as three-dimensional vector files is the first preferred step of geographic/geometric deduction, wherein rooftops are identified by their location and the rest of the features and corresponding XY coordinates are filtered out of the geospatial data. FIG. 4 is a flowchart showing exemplary details of process 112 (in FIG. 3) for extracting buildings and rooftops as three-dimensional vector files. Operation of the present system is best understood by viewing FIGS. 3 and 4 in conjunction with one another. As shown in FIG. 4, at step 405, DEM analysis software is configured to the GIS 100. Examples of DEM analysis software are LiDar Analyst™ by Visual Learning Systems, and SilverEye™ by GeoTango International Corp. This software enables the extraction of building/spatial features using automated/semi-automated processes.

In step 410, the Digital Elevation Model file is loaded into GIS system 110 for analysis. Z (height) data values must be available to provide attribute differentials during extraction. In step 415, the identification of building features is ordered from the XYZ model (DEM/DTM) using the necessary spatial parameters. Spatial parameters are necessary to enable geometric processing. In the case of residential rooftops, these spatial parameters may include, for example: 1) size of building surface—>10 m² <40 m²; 2) slope parameters— >5°-<40°; 3) texture variance, which assists in differentiating between trees, clutter, buildings etc.; and 4) distance above recognized surface (e.g., distance above ground)—>3 m-<15 m. When analyzing the solar potential of commercial rooftops, these parameters may vary (e.g., slope is often 0°, area is >100 m², etc.).

In step 420, rooftop polygons (rooftop 'shapes') are extracted from virtual city 111 as three-dimensional (XYZ) as multi-component sections, in order to allow for further processing. In step 425, the polygons (which, in Geographic Information Systems, are files in vector format typically referred to as 'shapefiles') are saved with attributes, which may include calculated areas for multiple roof components, roof type (e.g., gabled, complex etc.), general polygon slope, and which must include X, Y, and Z values. Typical attributes include roof type, slope, area, etc. In step 430, these shapefiles are imported into geodatabase 104, with multi-component rooftop FIDs (feature IDs) joined to parcel IDs and georeferenced to all other data.

Figure 5:
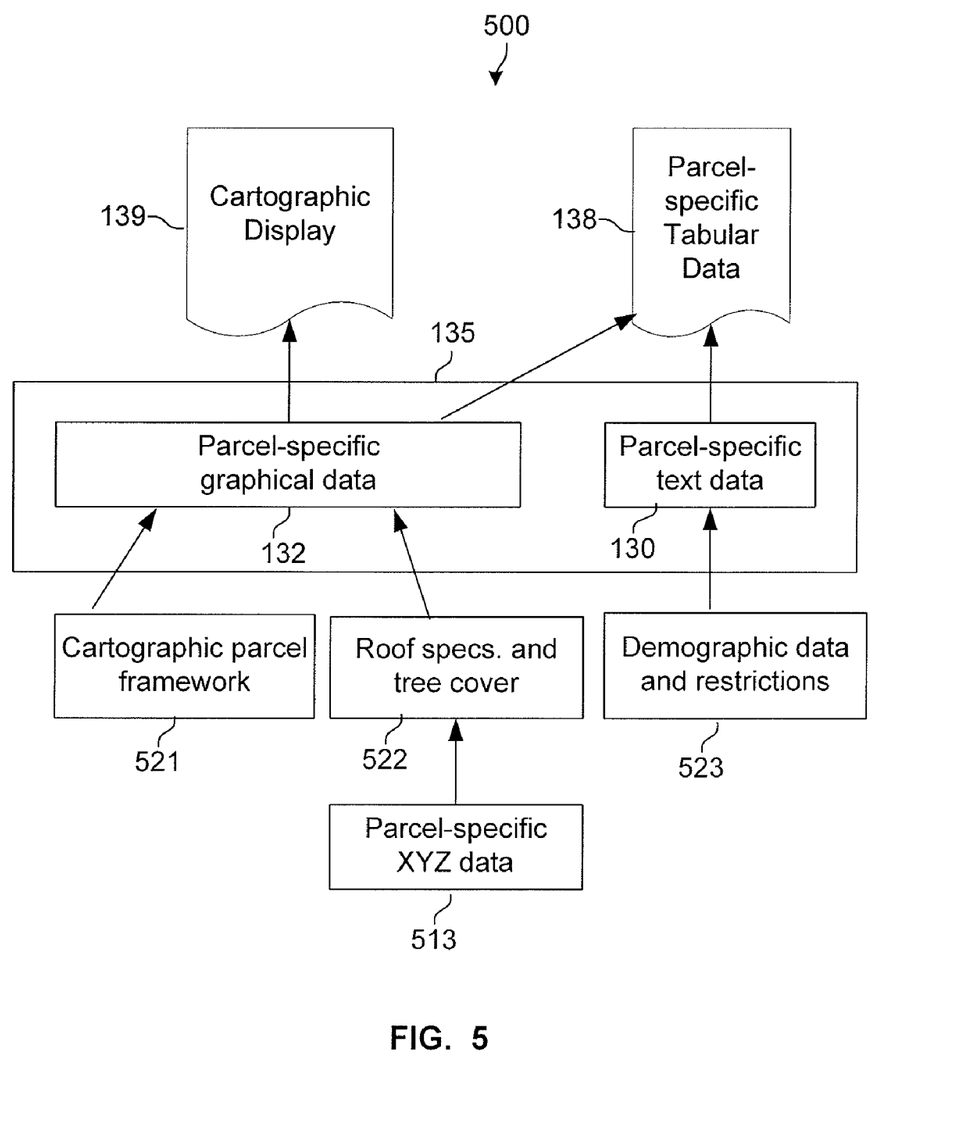
FIG. 5 is a flowchart showing exemplary datasets that serve as inputs to the present system.

Each of the shapefiles contains attributes, but none are bound to the output without further processing, which is necessary to produce data in geospatial/cartographic format for use in the processes that follow. Shown in FIG. 5 is the concept 500 of datasets that serve as inputs to the present system 100. In an exemplary embodiment, these datasets may include parcel-specific LiDar or other DEM (XYZ) data 513, parcel building frame data, parcel-specific census data, and parcel-specific electrical usage.

The control arrow between blocks 513 and 522 signifies the processing that enables these datasets to serve as bound cartographic frameworks, offers precise readings of roof specifications and shade, and allow for restrictions to be placed on the large demographic datasets that will reveal only the parcels that adhere to the geodemographic parameters set and/or input by a system user. Parcel building frame data 511 and other spatial requirements 512 are processed to generate cartographic frameworks 521, and, in one embodiment, parcel-specific LiDar data 513 is used to generate geometric display data 522 of roof specifications and tree cover. Parcel-specific census data and parcel-specific electrical usage are used to generate demographic restrictions 523, such as parcel value, home ownership, household income etc.

The processed data described above is registered in the geodatabase 104 as specific addresses that have satisfied criteria used by processing algorithms to reveal the parcels (home sites) that meet a threshold solar potential. Cartographic framework 521 and display data 522 are combined to generate parcel-specific cartographic data 132 (FIGS. 3 and 5), and demographic data and restrictions 523 are used to generate parcel-specific text data 130. Graphical data 132 and text data 130 comprise the output-ready solar census 135, stored in database 104.

In an exemplary embodiment, when database 104 is queried/filtered to generate the final output, the database output takes the form of:

(1) A map 139 indicating the precise locations of the parcels that have met or exceeded the solar-potential criteria used in the process; and (2) A table 138 containing variable parameters (specifications) indicated above with respect to FIG. 1, and additionally including addresses for each parcel.

Figure 6:
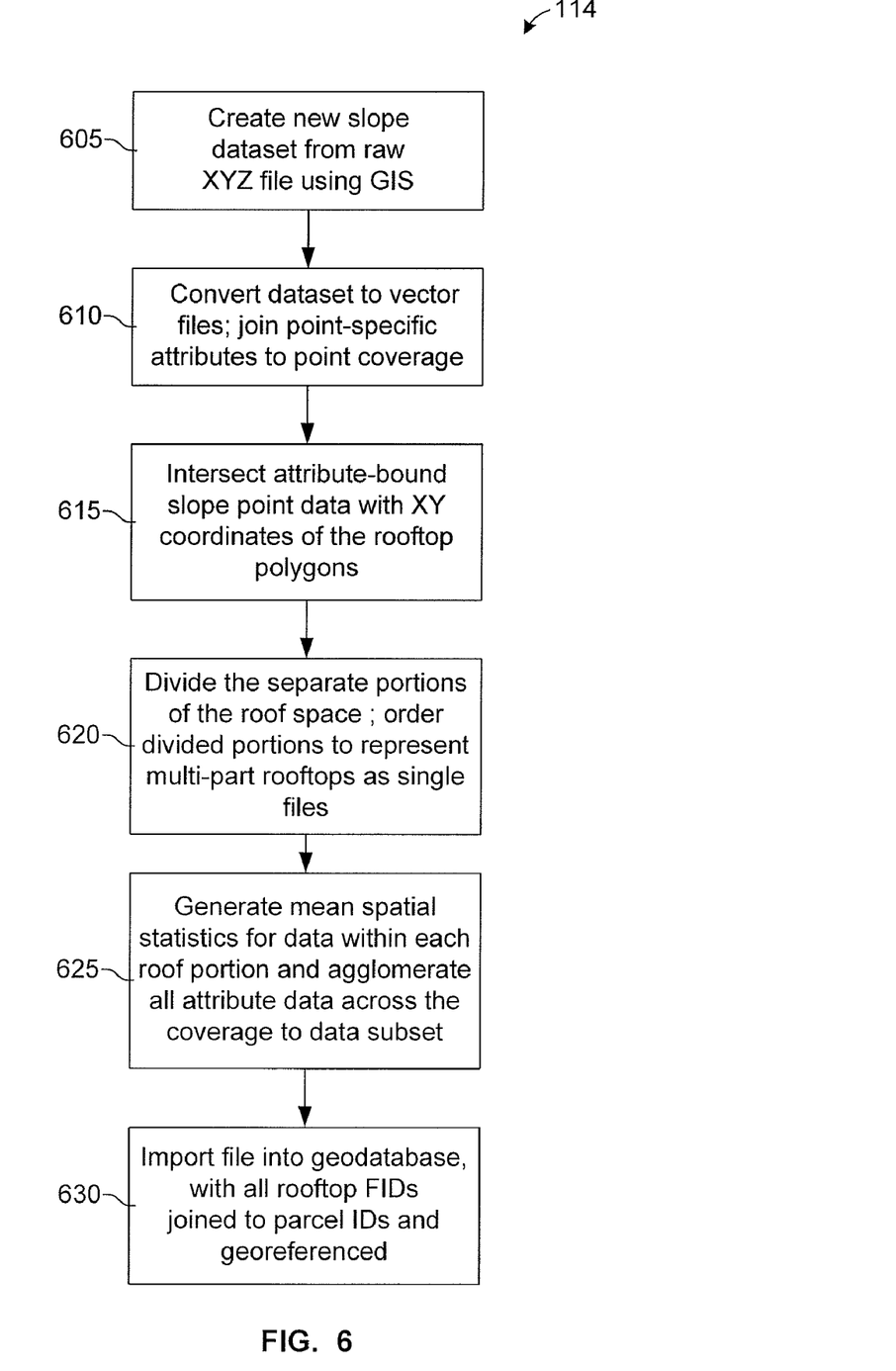
FIG. 6 is a flowchart showing exemplary details of process 114 for roof portion-specific slope extraction.

FIG. 6 is a flowchart showing exemplary details of process 114 (in FIG. 3) for roof portion-specific slope extraction. As shown in FIG. 6, in step 605, a new slope dataset is created from raw XYZ file data using the GIS 110. This conversion is applied to the entire dataset. The new slope layer is then converted to integer format. In step 610, the dataset is converted to points, and point-specific attributes are bound to point coverage. There is now one datum for every point within the coverage.

In step 615, the extracted rooftop polygons are added to the GIS workspace, and the attribute-bound slope point data is intersected with the XY coordinates of the rooftop polygons. All points that fall outside the polygons are deleted. There is now a single dataset that represents one slope datum (e.g., 18°) per point at the given resolution within the rooftop area only.

In step 620, statistical divisions and anomalies that divide the separate portions of the roof space are calculated, and the divided portions are ordered to represent the multi-part rooftops and bind attribute sub-data to their respective portions on the XY plane.

In step 625, the mean spatial statistics of all data within each roof portion are generated and all attribute data is agglomerated across the coverage to this point-in-polygon subset to create an agglomerated attribute file.

This attribute file is then imported into the geodatabase 104 at step 630, with all rooftop FIDs joined to parcel IDs and georeferenced. An output example is the following tabular data indicating parcel address, roof-section polygon feature identification number, roof-section slope (determined by extracted Z statistics), and roof section dimensions:

29 Palms Ave, Miami Fla. 33107
    FID1-16° (X meters/Y meters)
    FID2-16° (X meters/Y meters)
    FID3-22° (X meters/Y meters)
    FID4-22° (X meters/Y meters)

Figure 7:
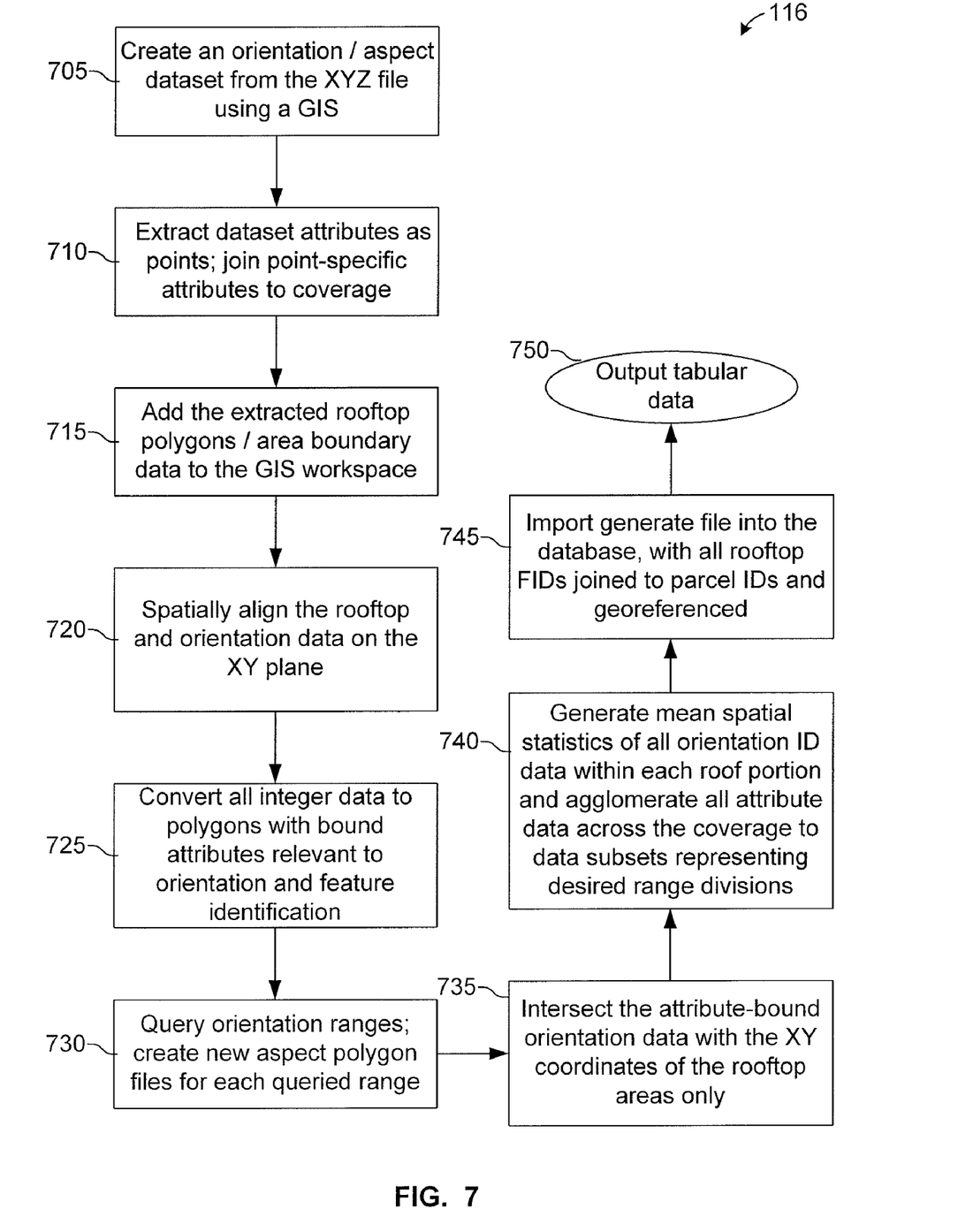
FIG. 7 is a diagram showing an example of process 116 for determining roof orientation.

FIG. 7 is a diagram showing an example of process 116 for determining roof orientation. As shown in FIG. 7, in step 705, an orientation/aspect dataset is created from the XYZ data file using GIS 110. This conversion is to be applied to the entire dataset; new orientation data is then converted to text and integer formats. In step 710, all integer data is converted to points, and point-specific attributes are bound to point coverage. There is now one datum for orientation for every point within the coverage.

In step 715, the extracted rooftop polygons/area boundary data are added to the GIS workspace, and in step 720, rooftop data files and orientation point data are georeferenced so that the data is aligned on the XY plane. In step 725, all integer data is converted to polygons with bound attributes relevant to orientation and feature identification.

In step 730, orientation ranges (e.g.: I, II, and III (120-170, 171-220, and 221-280) are queried to create new aspect polygon files for each queried range. The purpose of this operation is to divide the orientation of the roof areas into individual files for a DBMS (database management system) such as SQL. The present step identifies the orientation of a single roof portion, as almost all rooftops in their entirety are orientated to 360° of the horizontal plane. Extracting the individual attributes can be done as single integers without queries as well. In step 735, the attribute-bound orientation point/polygon data is intersected with the XY coordinates of the rooftop areas only. All points that fall outside these coordinate boundaries are deleted. There are now datasets in any division, determined by the user's DBMS query preferences, that represents one datum (e.g., 180°/south) per point inside the individual rooftop portions. In step 740, the mean XY statistics of all orientation ID data within each roof portion are generated, and all attribute data is agglomerated across the coverage to point-in-polygon subsets representing range divisions as preferred. The resulting data is stored in an agglomerated attribute file.

In step 745, this attribute file is imported into the geodatabase 104, with all rooftop FIDs joined to parcel IDs and georeferenced. An output example of tabular data generated from this attribute file (at step 750) is shown below:

29 Palms Ave, Miami Fla. 33107
 FID1-72° ENE
 FID2-162° SSE
 FID3-252° WSW
 FID4-342° NNW The GIS database 104 is controlled by queries, the desired purpose of which is to locate portions of rooftops with optimum orientation for solar power. However, the present method ultimately allows for all rooftops to be split and identified by orientation regardless of user preference.

Figure 8:
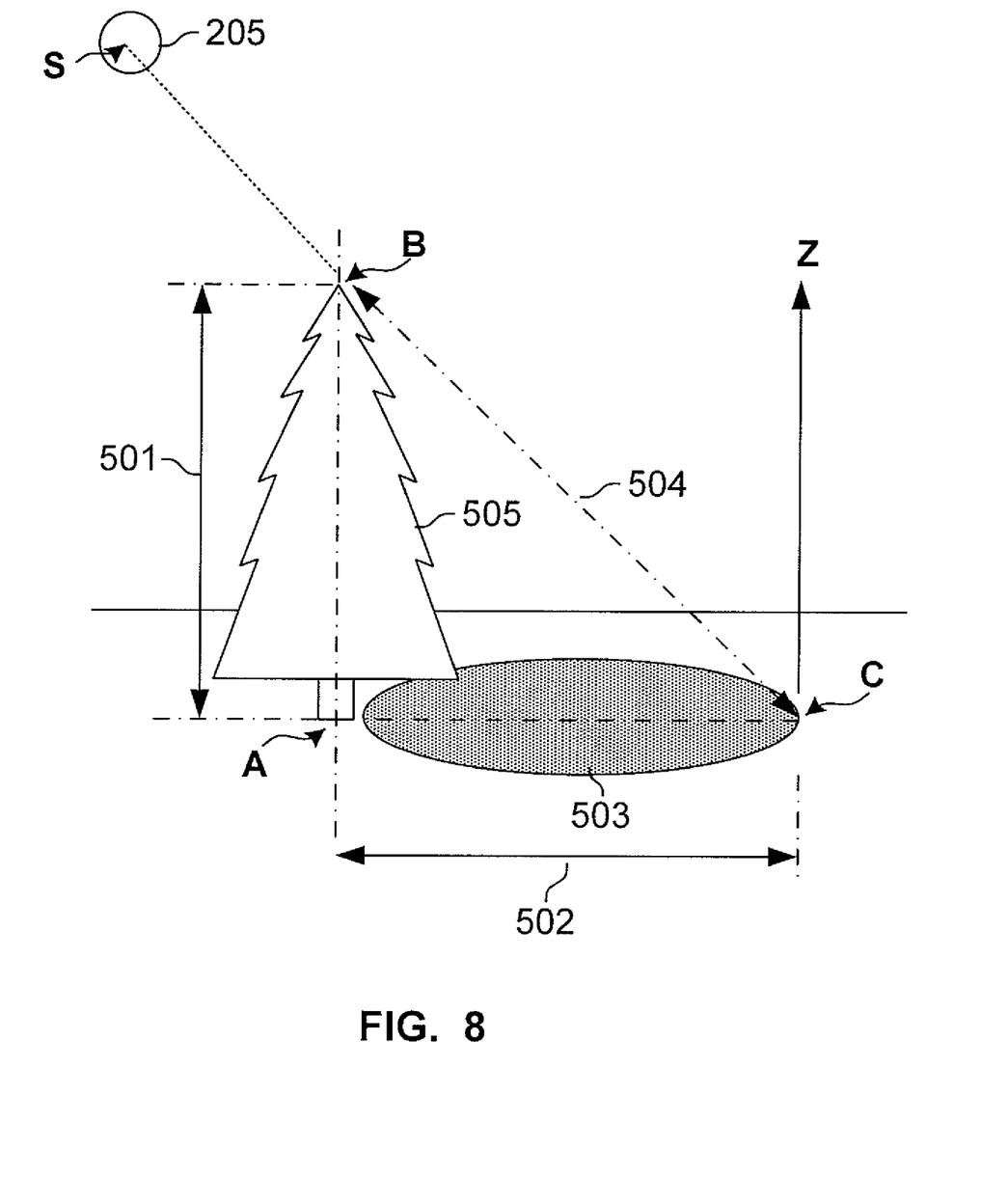
FIG. 8 is a flowchart showing an exemplary method for determining annual tree shade patterns.

FIG. 8 is a diagram showing an exemplary method for determining annual tree shade patterns. To accurately simulate annual shade patterns cast by trees and surrounding obstructions, a tree cover algorithm creates a series of overlapping vector files around trees identified by, for example, LiDar canopy files.

A 'zenith angle' is the angle between the local zenith and a line of sight to an object (i.e., the Sun 205). If point C=a point on the ground site, point Z=any point directly above point C (e.g., the zenith), and point S=the Sun, then the Sun's viewing zenith angle=the angle ZAS. The zenith angle z is thus defined to be the angle subtended by the sun at the center of the earth and normal (perpendicular) to the surface of the earth. The zenith angle in the example of FIG. 8 is the angle subtended by the Sun (point S), point C, and the zenith Z, or angle SCZ, which is equal to angle (90°—ACB), the complement of the angle between the horizon and the sun as viewed from the edge of shadow 503 furthest from tree 505.

Simulated monthly (or other interval) shadow extent is then extracted based on the latitude/longitude (XY) location of individual building and tree height (determined by Z value in the data). Simple Pythagorean geometry with automated shadow identification using grey-scale range is employed in the tree cover algorithm as follows:

1) GIS 100 locates point A (bottom of tree/established surface at relative elevation 0.0, the 'bare Earth' surface) at a point on the vegetation.
2) Point B (top of tree) is located via LiDar data, using the Z value for that point.
3) Tree height is distance 501 between A and B.
4) Point C is located by the GIS by determining the precise XY location on the surface based on the position of the sun relative to the tree/obstruction casting the shadow (line SBC). This line is a result of a simulated projection relative to the obstruction height B and XY surface location A.
5) The hypotenuse 504 of triangle ABC and the height of the tree 501 are extracted from these calculations, using the Pythagorean theorem, to yield the distance 502 the triangle can cover. A set of potential tree shadow arcs 503 can then be built on separate calculations (one for each month, or any other desired interval) using a geometric algorithm and solar zenith/altitude and azimuth data within the DEM, as described in FIG. 9. An alternative process that extracts the same data with the same geometry deploys 'line of sight' geometry to determine the line SBC referred to above, without employing trigonometry.
6) The filled-in arc 503 of annual shadow extent is then generated, using the method employed in FIG. 9, below.

Figure 9:
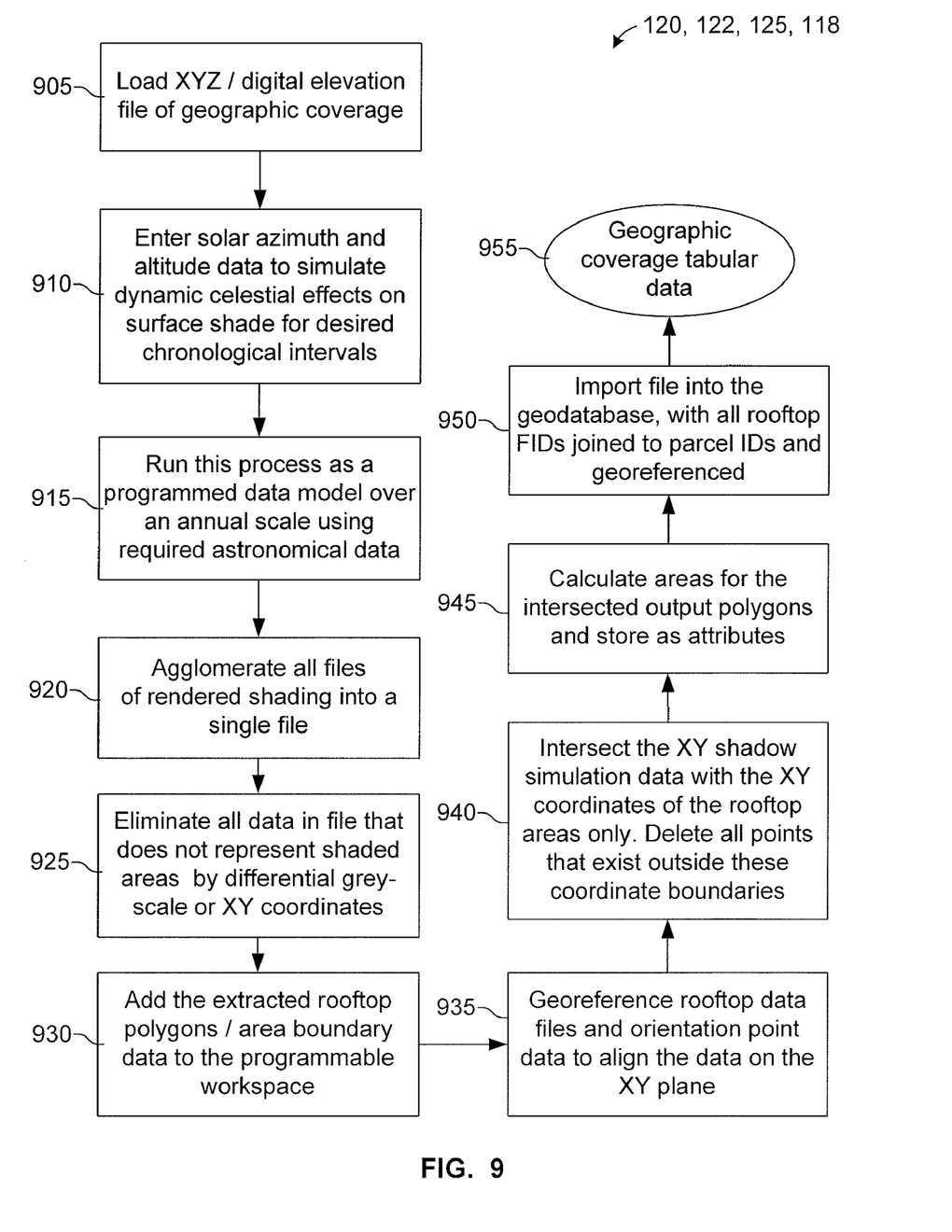
FIG. 9 is a flowchart showing exemplary details of the process for converting annual shadow extraction to usable roof area.

FIG. 9 is a flowchart showing exemplary details of the process for extracting annual shadow extraction and converting the data to usable roof area. This flowchart details steps 120, 122, 125, and 118 in FIG. 3, and employs the geometry shown in FIG. 8. More specifically, this conversion process is performed as follows.

In step 905, XYZ/digital elevation file of geographic coverage of the area for which data has been acquired (or other selected area of interest) is loaded into GIS 110. In step 910, solar azimuth and altitude data are entered into GIS 110 to simulate dynamic celestial effects on surface shade for desired chronological intervals. For example, a single entry may have a solar altitude of 59.2 and solar azimuth of 99.2 to simulate the shading effects over a three dimensional surface at 10:19 am on Aug. 3, 2006 at 80° W and 25° N.

To extract shadows cast by obstructions, the GIS/IGS applies the Pythagorean theorem. If (x0, y0) and (x1, y1) represent points in the plane, then the shadow cast will be determined by the altitude and azimuth angles of the sun relative to those coordinates. The height (Z) of the points creating the obstruction (e.g., tree top or tree branch, chimney, etc.) from the surface is $(a1-b1)^2$+the distance from that coordinate on the (XY) plane, determined by the astronomical position of the sun $(a2-b2)^2$. The hypotenuse BC of triangle ABC can then be generated as a straight line that simulates the shadow cast, in accordance with the equation $AC^2+BC^2=AB^2$.

This shadow-extraction process is repeated at desired intervals (e.g., 6 minutes) over an annual time period using the necessary astronomical data to generate multiple arcs/shadow spatial coverages that represent annual shade extent. The process is then run as a programmed data model, at step 915, to generate a set of rendered shading files. The model repeats this process at desired intervals (e.g., 6 minutes) over an annual time period using the necessary astronomical data.

In step 920, all of the files of rendered shading are agglomerated (or 'dissolved') into a single file; that is, a mosaic of the files is created. This rendered shading file contains pixels that represent the division between shaded and non-shaded areas, and can be stored in either XY (two-dimensional) or XYZ (three-dimensional) formats. This single file represents the complete shading effects from all objects on all objects within the geographic coverage for one year.

In step 925, all data in this file that does not represent shaded areas is eliminated. For example, if the user has chosen to cast shade over a tri-band color photograph of the coverage, the shaded areas may be represented by grey-scale/black pixels. In this case, all pixels that represent color integers (1-256) outside this grey-scale are eliminated. This new file represents only the XY coordinates (by pixel) that are shaded at any time or at specific intervals during the year (or other period of time). Alternatively, if the user is operating without orthophotographic data, the XY/XYZ coordinates of the shading areas are separated from those outside the shaded area in the geographic plane.

In step 930, the extracted rooftop polygons/area boundary data are added to the GIS workspace, and rooftop data files and orientation point data are georeferenced in order to align the data on the XY plane, in step 935. Next, in step 940, the XY shadow simulation data (output from step 925) is intersected with the XY coordinates of the rooftop areas to generate a dataset of intersected rooftop polygons. All points/pixels that exist outside these coordinate boundaries are deleted.

In step 945, areas for the intersected rooftop polygons are calculated and stored as attributes, which contain the usable roof area after the intersection process. These calculated areas for each individual rooftop polygon contain the total non-shaded usable area per single parcel, and are stored in a rooftop polygon area file.

In step 950, the rooftop polygon area file is imported into the geodatabase 104, with all rooftop FIDs joined to parcel IDs and georeferenced. An output example of tabular data 955 indicating geographic coverage is shown below:

19 Palms Ave, Miami Fla. 33107—U_AREA 38.652288 $m^2$

21 Palms Ave, Miami Fla. 33107—U_AREA 47.576952 $m^2$

23 Palms Ave, Miami Fla. 33107—U_AREA 12.930998 $m^2$

Additionally, the total usable area may be multiplied by coordinate-specific solar irradiance levels to provide the actual output of solar potential for a given roof, as opposed to indicating the roof area in square meters.

Tabular Data

In FIG. 3, at step 130, all data is imported into the geodatabase 104 in tabular form, using GIS 110. In an exemplary embodiment, the data is calculated and categorized into parcel-specific tabular data 138, as indicated below.

Columns for data import contain:
 (a) Roof space (total and portioned)
 (b) Roof portion orientation
 (c) Roof portion slope
 (d) Usable area for solar optimization (annual shading on rooftops)
 (e) Solar irradiance/insolation levels (adjusted per square meter)

These levels are calculated by multiplying the number of panels available to roof space by irradiance values for the local zone (e.g., 1280 w);
 (f) Address and parcel value
 (g) Object ID number (for spatial reference in a GIS)
 (h) Parcel APN number (for municipal legal boundary reference)
 (i) Parcel owner
 (j) Roof geometry (gabled, complex etc.)
 (k) Roof material (shingles, tiles etc.)—extracted with aerial/infrared spectrometer
 (l) Return on Investment (ROI)—estimated ROI for the optimal system available to a homeowner may be calculated by multiplying irradiance levels per square meter by available usable roof space/solar panel model/output, cost of panels, etc.

Other optional demographics may be imported from other sources (e.g., household income, marital status, etc.).

Rows for data import are organized by joining spatially referenced Object ID numbers to Feature ID numbers, and Parcel (APN) numbers, as indicated previously. Mathematical calculations, such as extraction of irradiance levels (e) from usable area (d) can be completed inside or outside the database, using Microsoft Excel or other utility program.

Thematic layers may be used as data inputs to simplify the geometric relationships within the database. These layers are utilized to extract items (a) through (l) above. These thematic layers include some or all of the following:

Municipal land parcel data, including census block group data, parcel streets/addresses, and parcel frameworks;

Aerial/orthophotography, including LiDar and infrared LiDar roof and clutter data Digital Elevation Model(s)/ground features as 3D XYZ data;

Geospatial climate dynamics (weather patterns, rainfall, cloud cover, temperature etc) at preferred/available grid resolution (e.g., 10 $km^2$, distributed point-specific weather station data);

Area-specific irradiance levels;

Infrared spectrum coverage by remote sensing;

Estimated return on investment—estimated kW/H per month of solar potential by parcel as adjusted by state and municipal rebate programs, hardware costs, etc.

In FIG. 3, at step 132, GIS database 104 receives spatial and tabular imports with the following characteristics:

Data must be standardized with respect to inputs and outputs; and

Data must be georeferenced correctly to adhere to established Cartesian spheroid projection.

Cartographic Data

Figure 10:
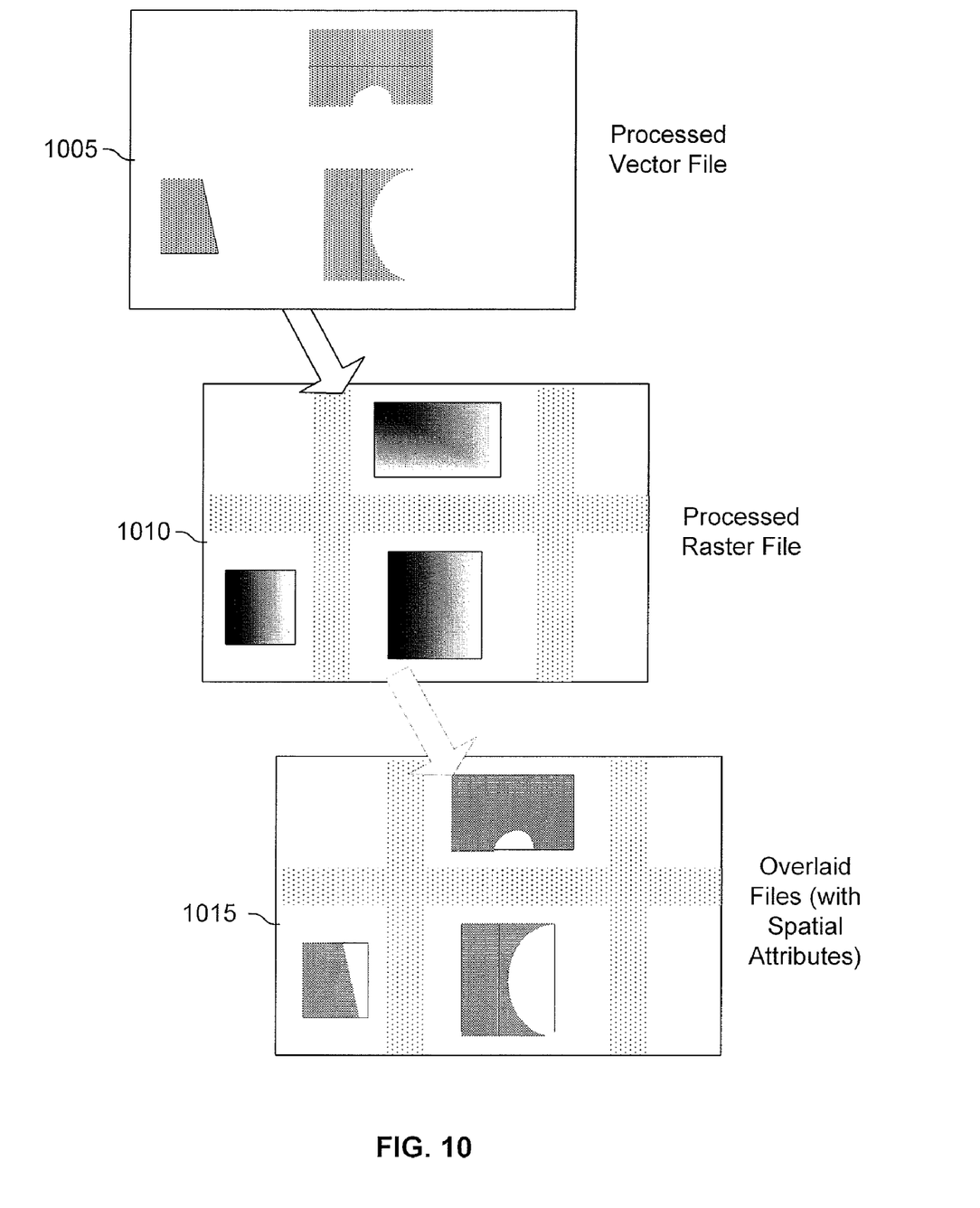
FIG. 10 is a flowchart showing exemplary details of a process for generating cartographic data.

FIG. 10 is a flowchart showing exemplary details of process 132 (in FIG. 3) for generating cartographic data 139. Initially, all spatial/vector files created by processes 120, 122, 105, 118, 112, 114, 116 and 104 are imported to geodatabase 104. A differentiation is made between the attributes of extracted data (tabular) and the spatial files (cartographic) in this step.

A greatly simplified sample of a processed vector file 1005 is shown in FIG. 10. In order to create this vector file 1005, aerial/orthophotographic files of same coverage/coordinates are imported into database 104. These files are georeferenced using the same cartographic spheroid (e.g., UTM Zone 17, Clarke 1866) as the original spatial/vector files. The orthophotographic layer is then clipped to the spatial boundaries of land parcel data and rooftop polygons. Object identification numbers are generated for each clipped orthophotograph and joined to appropriate spatial identification of the vector files to generate processed raster file 1010.

Layers 1005 and 1010 are then overlaid and bound cartographically in the GIS with spatial attributes for use (at steps 134 and 135 in FIG. 3) in the DBMS environment, to create overlaid raster files 1015 with spatial attributes. The inclusion of raster files facilitates the marketing of the present technology, and may be considered as part of the overall solar census process. However, a solar census can be achieved geometrically without the photography. Aerial photographs are not required in the geometric extraction process, as they are simply 2-D photos which provide visual assistance for a system user or a buyer of the service, and should be understood as functionally separate from the aerial photogrammetry referred to in FIG. 2A.

In an exemplary embodiment, raster file data is formatted into cartographic display 139, and tabular parcel-specific data is printed out as text 138. Both tabular data and cartographic data may be filtered at step 134 in accordance with user preferences by querying GIS database 104.

Certain changes may be made in the above methods and systems without departing from the scope of that which is described herein. It is to be noted that all matter contained in the above description or shown in the accompanying drawings is to be interpreted as illustrative and not in a limiting sense. For example, the methods shown in FIGS. 1 through 10 may include steps other than those shown therein, and the systems shown in the Figures may include different components than those shown in the drawings. The elements and steps shown in the present drawings may be modified in accordance with the methods described herein, and the steps shown therein may be sequenced in other configurations without departing from the spirit of the system thus described. The following claims are intended to cover all generic and specific features described herein, as well as all statements of the scope of the present method, system and structure, which, as a matter of language, might be said to fall there between.

What is claimed is:

1. A method for identifying the solar potential of rooftops comprising:
    entering, into a geographic information system, solar-potential criteria and three-dimensional spatial data and tabular data, including parcel addresses, for a selected area including parcels on which the rooftops are located;
    collecting three-dimensional aerial data of the selected area, including the rooftops in the selected area, wherein each of the rooftops comprises one or more rooftop shapes;
    calculating solar azimuth and altitude angles for regular intervals to generate XYZ shadow simulation data representing shade cast onto the rooftops by obstructions;
    intersecting the shadow simulation data with XYZ coordinates of the rooftop shapes to generate the shade cast by the obstructions onto the rooftops for specific intervals over a specific period of time; and
    using the tabular data and the shade cast by the obstructions to determine addresses and per-parcel specifications of buildings having said rooftops meeting the solar-potential criteria.

2. The method of claim 1, wherein the shade cast by the obstructions onto the rooftops is determined by:
    generating a virtual city for the selected area using raw data from a digital elevation model, integrated with data from real-world features from the aerial data, of the selected area;
    extracting the rooftop shapes as three-dimensional data, from the virtual city; and
    determining the shade cast by obstructions from the shadow simulation data, by generating spatial coverages that represent annual shade extent, on each of the rooftop shapes, of each corresponding one of the obstructions.

3. The method of claim 1, wherein the obstruction shadows are determined by:
    locating an established surface at zero relative elevation at a point A on a particular said obstruction casting shade onto one of the rooftops;
    locating the top B of the particular obstruction via XYZ data, using the Z value for point A;
    calculating the height of the particular obstruction;
    locating point C of triangle ABC by determining the XYZ location on the established surface based on the position of the sun relative to the particular obstruction;
    extracting the height of the particular obstruction and the hypotenuse of shade triangle ABC to yield the distance the triangle can cover; and
    generating a shadow arc of annual shade cast by the particular obstruction, using calculations, for each desired said interval, employing solar altitude and azimuth data.

4. The method of claim 3, wherein the XYZ data from a digital elevation model is used to locate the top B of the obstruction and to locate point C.

5. The method of claim 1, wherein the three-dimensional spatial data includes a digital elevation model of the selected area.

6. The method of claim 1, wherein the tabular data includes solar irradiance levels for the selected area.

7. The method of claim 1, wherein the aerial data is collected via remote sensing technology.

8. The method of claim 1, wherein at least some of the aerial data is collected via infrared imaging.

9. The method of claim 1, wherein at least some of the aerial data is collected via interferometric synthetic aperture radar.

10. The method of claim 1, wherein the tabular data and the spatial data include data selected from the list of data types consisting of size of building surface, slope parameters, texture variance, and distance above a recognized surface.

11. A method for identifying the solar potential of rooftops comprising:
    collecting three-dimensional aerial data of a selected area including parcels within which the rooftops are located;
    generating a digital elevation model of the selected area from the aerial data;
    generating obstruction shadows for each obstruction casting a shadow onto one of the rooftops, using solar positions calculated at intervals over a specific period of time;
    determining usable area remains, on each of the rooftops, from the digital elevation model and the obstruction shadows;
    intersecting the usable area remains with total roof area, for each of the rooftops, to generate shadow-free areas on the rooftops that are free of said obstruction shadows over the specific period; and
    using the shadow-free areas and tabular data for parcels in the selected area to determine addresses and per-parcel solar potential specifications of buildings having said rooftops.

12. The method of claim 11, wherein the shadow-free areas are determined by:
    generating a virtual city for the selected area using raw data from a digital elevation model, integrated with data from real-world features from the aerial data, of the selected area;
    extracting the rooftop shapes as three-dimensional data, from the virtual city;
    calculating the shade cast by obstructions from the shadow simulation data, by generating multiple arcs that represent annual shade extent, on each of the rooftop shapes, of each corresponding one of the obstructions; and
    deleting all points that exist outside the coordinate boundaries of the shade cast by obstructions, to yield the shadow-free areas.

13. The method of claim 11, wherein the obstruction shadows are determined by:
    locating an established surface at zero relative elevation at a point A on a particular said obstruction casting shade onto one of the rooftops;
    locating the top B of the particular obstruction via the three-dimensional aerial data, using the Z value for point A;
    calculating the height of the particular obstruction;
    locating point C of triangle ABC by determining the XYZ location on the established surface based on the position of the sun relative to the particular obstruction;
    extracting the height of the particular obstruction and the hypotenuse of shade triangle ABC to yield the distance the triangle can cover; and
    generating a shadow arc of annual shade cast by the particular obstruction, using calculations, for each desired said interval, employing solar altitude and azimuth data.

14. The method of claim 13, wherein the XYZ data used to locate the top B of the obstruction and to locate point C is extracted from the virtual city.

15. The method of claim 11, wherein the tabular data includes solar irradiance levels for the selected area.

16. The method of claim 11, wherein the aerial data is collected via remote sensing technology.

17. The method of claim 11, wherein the tabular data and the spatial data further include data selected from the list of data types consisting of parcel addresses, size of building surface, slope parameters, texture variance, and distance above a recognized surface.

18. A method for identifying the solar potential of rooftops in a selected area comprising:
- generating a virtual city for the selected area using raw data from a digital elevation model, integrated with data from real-world features, of the selected area;
- extracting rooftop shapes from the virtual city as three-dimensional data;
- extracting geospatial data from the digital elevation model, including three-dimensional data files representing the rooftops, wherein the rooftops are identified by their respective parcel addresses, and wherein each of the rooftops comprises one or more rooftop shapes;
- extracting, from the virtual city, the rooftop shapes as sections of each of the rooftops;
- calculating solar azimuth and altitude angles for regular intervals over a specific time period to generate XYZ shadow simulation data representing shadows cast onto the rooftops by obstructions;
- running a programmed data model over an annual period using the solar azimuth and altitude angles to generate a set of rendered shading files comprising the XYZ shadow simulation data;
- agglomerating the rendered shading files into a single file;
- extracting shadows cast by obstructions from the shadow simulation data by intersecting the shadow simulation data with XYZ coordinates of the rooftop shapes, to generate XYZ patterns that represent annual shadow extent of each of the obstructions for specific intervals over a specific period of time; and
- identifying the solar potential of rooftops in the selected area by using tabular data for parcels in the selected area and the shadow simulation data to correlate addresses of buildings having said rooftops with predetermined solar-potential criteria.

19. The method of claim 18, wherein the tabular data and the geospatial data include data selected from the list of data types consisting of parcel addresses, size of building surface, slope parameters, texture variance, and distance above a recognized surface.

20. The method of claim 18, wherein the digital elevation model is generated from data acquired via remote sensing technology.

21. A method for identifying the solar potential of rooftops in a selected area comprising:
- determining XYZ data values for the rooftops and obstructions from aerial data corresponding to the selected area;
- determining the shade cast by each of the obstructions onto each of the rooftops by:
  - locating an established surface at zero relative elevation at a point A on a particular said obstruction casting shade onto one of the rooftops;
  - locating the top B of the particular obstruction via the XYZ data values, using the Z data value for point A;
  - calculating the height of the particular obstruction;
  - locating point C of triangle ABC by determining the XYZ location on the established surface based on the position of the sun relative to the particular obstruction;
  - extracting the height of the particular obstruction and the hypotenuse of shade triangle ABC to yield the distance the triangle can cover; and
  - generating a shadow arc of annual shade cast by the particular obstruction, using calculations, for each desired said interval, employing solar altitude and azimuth data; and
- identifying the solar potential of rooftops in the selected area by using tabular data for parcels in the selected area and the shadow arc of annual shade cast by each of the obstructions to correlate addresses of buildings having said rooftops with predetermined solar-potential criteria.

22. The method of claim 21, wherein the XYZ data values used to locate the top B of the obstruction and to locate point C are extracted from a digital elevation model.

23. The method of claim 21, wherein the aerial data is collected via remote sensing technology.

24. A system for identifying the solar potential of rooftops comprising:
- means for collecting three-dimensional aerial data of a selected area including parcels on which the rooftops are located, wherein the aerial data includes obstruction shadows cast over the rooftops;
- means for generating a digital elevation model of the selected area;
- means for determining usable area remains, on each of the rooftops, from the digital elevation model, the obstruction shadows, and solar zenith angles calculated at intervals over a twelve month period;
- means for extracting roof shapes from the digital elevation model; and
- means for intersecting the usable area remains with the total roof area, for each of the rooftops, to generate data having spatial attributes indicating areas on the rooftops that are free of said obstruction shadows over the twelve month period.

* * * * *